(12) United States Patent
Jiao

(10) Patent No.: US 7,008,814 B2
(45) Date of Patent: Mar. 7, 2006

(54) METHOD AND APPARATUS FOR INCREASING DIGITAL COLOR IMAGING UTILIZING TANDEM RGB PHOTODIODES

(75) Inventor: Jinbao Jiao, Gurnee, IL (US)

(73) Assignee: Motorola, Inc., Schaumburg, IL (US)

(*) Notice: Subject to any disclaimer, the term of this patent is extended or adjusted under 35 U.S.C. 154(b) by 145 days.

(21) Appl. No.: 10/271,303

(22) Filed: Oct. 15, 2002

(65) Prior Publication Data

US 2004/0038443 A1 Feb. 26, 2004

Related U.S. Application Data

(63) Continuation-in-part of application No. 10/226,731, filed on Aug. 23, 2002.

(51) Int. Cl.
*H01L 21/00* (2006.01)

(52) U.S. Cl. .................. 438/57; 438/77; 438/483
(58) Field of Classification Search ............ 438/57, 438/48, 66, 69, 73, 77, 91, 93, 95, 142
See application file for complete search history.

(56) References Cited

U.S. PATENT DOCUMENTS

| | | | | |
|---|---|---|---|---|
| 5,225,031 A | * | 7/1993 | McKee et al. | |
| 5,965,875 A | | 10/1999 | Merrill | |
| 6,023,082 A | * | 2/2000 | McKee et al. | |
| 6,342,405 B1 | * | 1/2002 | Major et al. | 438/22 |
| 6,521,968 B1 | * | 2/2003 | Kuhara et al. | 257/462 |
| 6,593,596 B1 | * | 7/2003 | Nanishi et al. | |
| 2002/0058353 A1 | * | 5/2002 | Merill | 438/57 |
| 2002/0125472 A1 | * | 9/2002 | Johnson et al. | 257/21 |
| 2003/0020070 A1 | * | 1/2003 | Rockwell et al. | 257/76 |
| 2003/0020078 A1 | * | 1/2003 | Klosowiak et al. | 257/83 |

* cited by examiner

*Primary Examiner*—Savitri Mulpuri
(74) *Attorney, Agent, or Firm*—James A. Lamb

(57) ABSTRACT

An apparatus is directed to increasing the resolution of digital color imaging that includes a photosensing semiconductor structure. The apparatus provides a monocrystalline silicon substrate, a first buffer layer epitaxially formed and overlying the monocrystalline silicon substrate, and a first photodiode layer overlying the first buffer layer and operable to provide a first signal indicative of a color associated with a first wavelength of light. The apparatus may further provide a second buffer layer overlying the first photodiode layer and a second photodiode layer overlying the second buffer layer operable to provide a second signal indicative of a color associated with a second wavelength of light. The first buffer layer may include a first monocrystalline oxide layer epitaxially formed to the monocrystalline silicon substrate, a monocrystalline compound semiconductor material overlying the monocrystalline oxide layer, and a second monocrystalline oxide layer overlying the monocrystalline compound semiconductor material layer and epitaxially formed to the monocrystalline compound semiconductor material layer.

8 Claims, 3 Drawing Sheets

METHOD AND APPARATUS FOR INCREASING DIGITAL COLOR IMAGING UTILIZING TANDEM RGB PHOTODIODES

RELATED APPLICATIONS

This application is a C.I.P of U.S. patent application Ser. No. 10/226,731, filed Aug. 23, 2002, entitled "Method and Apparatus for Increasing Digital Color Imaging Utilizing Tandem RGB Photodiodes", to Jinbao Jiao.

FIELD OF THE INVENTION

In general, the invention relates to digital color imaging. More specifically, the invention relates to an apparatus and method for increasing digital color imaging utilizing a photosensing semiconductor structure including tandem red, green, and blue (RGB) photodiodes.

BACKGROUND OF THE INVENTION

Digital imaging devices include, among many others, systems for imaging resolution. Such control impacts important aspects of digital imaging, paramount among which is resolution. There are many types of digital imaging systems utilized throughout the industry and implemented in various manners. For example, digital imaging technologies are included in cameras, scanners, printers, microscopes, etc.

Industry practices currently include, in one form or another, a single layer bank of three photodiodes located horizontally, side-by-side. The bank of photodiodes typically includes a multi-filter layer covering the photodiodes that includes a different filter for each photodiode encompassing one of three color bands (red, green, and blue).

Unfortunately, this configuration occupies three times the lateral space as a single photodiode requires, such as, for example in black/white digital imaging devices. Consequently, resolution utilizing current industry practices is typically three times greater for black/white applications when compared to color applications.

It would be desirable, therefore, to provide a method and system that would overcome these and other disadvantages.

SUMMARY OF THE INVENTION

The present invention is directed to an apparatus and process for increasing digital color imaging. The invention provides for a photosensing semiconductor structure including tandem RGB (red, green, and blue) photodiodes.

One aspect of the invention provides a tandem color photosensing semiconductor structure apparatus including a monocrystalline silicon substrate. The apparatus further includes a first buffer layer epitaxially formed and overlying the monocrystalline silicon substrate. The apparatus additionally includes a first photodiode layer overlying the first buffer layer and operable to provide a first signal indicative of a color associated with a first wavelength of light.

In accordance with another aspect of the invention, the invention provides a process for fabricating a tandem color photosensing semiconductor structure. The process includes providing a monocrystalline silicon substrate. The process further includes depositing a first buffer layer overlaying a monocrystalline silicon substrate, the first buffer layer epitaxially forming a monocrystalline oxide layer overlying the monocrystalline silicon substrate. The process additionally includes forming a first photodiode layer overlying the first buffer layer, the first photodiode layer operable to provide a first signal indicative of a color associated with the first wavelength of light.

The foregoing and other features and advantages of the invention will become further apparent from the following detailed description of the presently preferred embodiment, read in conjunction with the accompanying drawings. The detailed description and drawings are merely illustrative of the invention rather than limiting, the scope of the invention being defined by the appended claims and equivalents thereof.

DETAILED DESCRIPTION OF THE PRESENTLY PREFERRED EMBODIMENT

The present invention relates to increasing digital color imaging and more particularly to a method and system for increasing the resolution of digital color imaging utilizing a photosensing semiconductor structure including tandem RGB photodiodes. The invention provides for stacking a bank of RGB photodiodes by utilizing inherent properties of a monocrystalline substrate, photodiodes interspersed with buffer layers, and a molecular beam epitaxy process. It is a goal of the invention to increase the resolution of a digital color imaging system by reducing the area required by current industry lateral designs thereby allowing more photosensing photodiode groupings to utilize the same amount of space. The present invention seeks to utilize the molecular beam epitaxy process to produce a stable crystal lattice structure resulting in the formation of a compliant buffer layer.

Illustrative Imaging Cell

Figure 1:
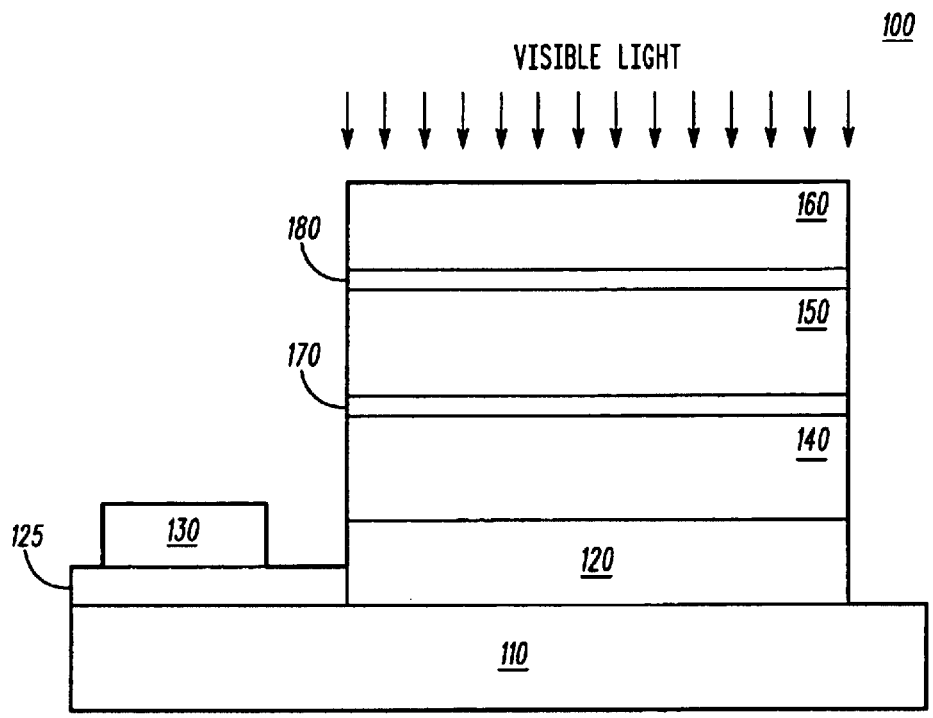
FIG. 1 is a schematic diagram illustrating a device structure according to an embodiment of the present invention.

FIG. 1 is a schematic diagram illustrating a device structure 100, also referred to an imaging cell, according to an embodiment of the present invention. Device structure 100 includes a monocrystalline substrate 110, a first buffer layer 120, a monocrystalline oxide layer 125, an exemplary semiconductor device 130, a first photodiode layer 140, a second photodiode layer 150, a third photodiode layer 160, a second buffer layer 170, and a third buffer layer 180.

Monocrystalline substrate 110 is a monocrystalline wafer, preferably a monocrystalline silicon wafer, utilized as the device structure 100 substrate for the implementation of the present invention. First buffer layer 120 is formed overlying monocrystalline substrate 110 by a process of molecular beam epitaxy. First buffer layer 120 is a multilayer monocrystalline structure that provides a stable crystal lattice structural match and stress release utilizing a compliant buffer layer. First buffer layer 120 is detailed in FIG. 3a below.

Monocrystalline oxide layer 125 is formed overlying monocrystalline substrate 110 by a process of molecular beam epitaxy and provides acceptable lattice structural matching and stress release. In one embodiment, monocrystalline oxide layer 125 is formed from reactants including strontium, titanium, and oxygen (SrTiO), also referred to as STO. In another embodiment, monocrystalline oxide layer 125 is formed from reactants including barium, titanium and oxygen. In yet another embodiment, monocrystalline oxide layer 125 is formed from other reactants associated with molecular beam epitaxy, as is known in the art. In one example, 10 nm of STO is deposited on a silicon (Si) wafer.

Exemplary semiconductor device 130 is a processor operable to store and process data corresponding to signals received from photodiode layers (140, 150, and 160). Exemplary semiconductor device 130 is formed by conventional semiconductor processing as well known and widely practiced in the semiconductor industry. In one embodiment, exemplary semiconductor device 130 is implemented as a signal converter, as is known in the art, converting image signals (not shown) from photodiode layers (140, 150, and 160) into digital signals (not shown) indicative of an image. In another embodiment, exemplary semiconductor device 130 is implemented as a digital signal processor, as is known in the art, capable of controlling storage and/or printing of the aforementioned image.

In yet another embodiment, exemplary semiconductor device 130 is implemented as a combination of the signal converter and digital signal processor devices described above, as is known in the art. In one example, exemplary semiconductor device 130 is built on monocrystalline oxide layer 125 utilizing Gallium Arsenide (GaAs) thin film transistors deposited on the monocrystalline oxide layer 125.

First photodiode layer 140 is formed overlying first buffer layer 120 by conventional semiconductor processing as well known and widely practiced in the semiconductor industry. First photodiode layer 140 is built so as to absorb a portion of visible light, for example, the red portion. In one embodiment, first photodiode layer 140 is built utilizing a compound semiconductor, for example, gallium arsenide nitride (GaAsN). In an example, first photodiode layer 140 is built utilizing a $GaAs_{1-x}N_x$ compound semiconductor where a value (x=0.92+/-0.02) results in a photodiode of $GaAs_{0.08}N_{0.92}$. In this example, first photodiode layer 140 is built with a thickness of between 1-2 microns and absorbs radiation at greater than 630 nm.

Second buffer layer 170 is formed overlying first photodiode layer 140 by conventional semiconductor processing as well known and widely practiced in the semiconductor industry. Second buffer layer 170 is built so as to filter a portion of visible light, for example, the green portion. Second buffer layer 170 provides a stable lattice platform including a minimal lattice mismatch upon which additional photodiodes can be built. In one embodiment, second buffer layer 170 is built utilizing a compound semiconductor, for example, Gallium Arsenide Nitride (GaAsN). In an example, second buffer layer 170 is built utilizing a thin $GaAs_{1-y}N_y$ compound semiconductor layer (0.5–1 microns) where a value (y=0.92–0.95) results in a match of the lattices of second buffer layer 170 and first photodiode layer 140. In this example, second buffer layer 170 filters radiation at less than 630 nm.

Second photodiode layer 150 is formed overlying second buffer layer 170 by conventional semiconductor processing as well known and widely practiced in the semiconductor industry. Second photodiode layer 150 is built so as to absorb a portion of visible light, for example, the green portion. In one embodiment, second photodiode layer 150 is built utilizing a compound semiconductor, for example, Gallium Arsenide Nitride (GaAsN). In an example, second photodiode layer 150 is built utilizing a $GaAs_{1-x}N_x$ compound semiconductor where a value (x=0.95+/-0.02) results in a photodiode of $GaAs_{0.05}N_{0.95}$. In this example, second photodiode layer 150 is built with a thickness of between 0.3–0.8 microns and absorbs radiation between 530–570 nm.

Third buffer layer 180 is formed overlying second photodiode layer 150 by conventional semiconductor processing as well known and widely practiced in the semiconductor industry. Third buffer layer 180 is built so as to filter a portion of visible light, for example, the blue portion. Third buffer layer 180 provides a stable lattice platform including a minimal lattice mismatch upon which additional photodiodes can be built. In one embodiment, third buffer layer 180 is built utilizing a compound semiconductor, for example, Gallium Arsenide Nitride (GaAsN). In an example, third buffer layer 180 is built utilizing a thin $GaAs_{1-y}N_y$ compound semiconductor layer (0.2–0.5 microns) where a value (y=0.95–0.97) results in a match of the lattices of third buffer layer 180 and second photodiode layer 150. In this example, third buffer layer 180 filters radiation less than 530 nm.

Third photodiode layer 160 is formed overlying third buffer layer 180 by conventional semiconductor processing as well known and widely practiced in the semiconductor industry. Third photodiode layer 160 is built so as to absorb a portion of visible light, for example, the blue portion. In one embodiment, third photodiode layer 160 is built utilizing a compound semiconductor, for example, Gallium Arsenide Nitride (GaAsN). In an example, third photodiode layer 160 is built utilizing a $GaAs_{1-x}N_x$ compound semiconductor where a value (x=0.97+/-0.02) results in a photodiode of $GaAs_{0.03}N_{0.97}$. In this example, third photodiode layer 160 is built with a thickness of between 0.1–0.4 microns and absorbs radiation less than 500 nm.

An exemplary operation of the imaging cell 100 will now be described herein. In operation and referring to FIG. 1, visible light, reflecting off of an image, strikes imaging cell 100, the reflected light depicted by vertical arrows. An image contained within the reflected light is converted to a digital image by exemplary semiconductor device 130 based on signals received from one or more photodiode layers as described below.

As the light containing the reflected image passes through the compound semiconductor stack, each of several components within the stack operates upon it. Third photodiode layer 160 absorbs the blue portion of the visible light as it passes through the photodiode. Third buffer layer 180 filters non-absorbed blue spectrum light as the remaining longer portions of light are transmitted through the filter layer. Second photodiode layer 150 absorbs the green portion of the transmitted light as it passes through the photodiode. Second buffer layer 170 filters non-absorbed green spectrum light as the remaining longer portions of light are transmitted through the filter layer. First photodiode layer 140 absorbs the red portion of the transmitted light as it passes through the photodiode. Each photodiode produces an associated band gap voltage (eV), described in FIG. 2 below, based on the intensity of light absorbed.

Figure 2:
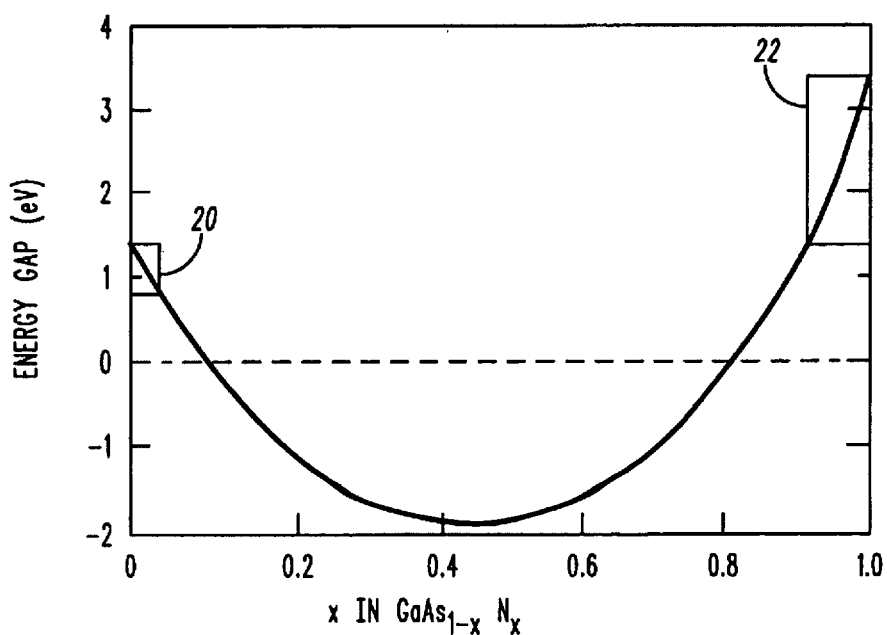
FIG. 2 is a graph illustrating band gap voltages of gallium arsenide nitride (GaAsN) for various concentrations of nitrogen (N)

FIG. 2 is a graph illustrating band gap voltages of gallium arsenide nitride ($GaAs_{1-x}N_x$) for various concentrations (x) of nitrogen (N). FIG. 2 includes an x-axis, a y-axis, and boxed areas 20 and 22. In FIG. 2, the x-axis represents the various concentrations (x) of nitrogen and a resulting concentration of gallium arsenide (1-x) within the gallium arsenide nitride compound. In FIG. 2, the y-axis calculated bandgap energies for gallium arsenide nitride (GaAsN) based on standard industry estimates. The boxed areas 20 and 22 in FIG. 2 enclose those areas of the curve representing materials obtainable with growth techniques commonly used in the industry.

In an example and referring to FIGS. 1 and 2 above, the first photodiode layer 140 built utilizing a $GaAs_{1-x}N_x$ compound semiconductor with a value (x=0.92) would result in a photodiode of $GaAs_{0.08}N_{0.92}$ and a resulting bandgap energy of approximately 1.7 eV. In another example and still referring to FIGS. 1 and 2 above, the second photodiode layer 150 built utilizing a $GaAs_{1-x}N_x$ compound semiconductor with a value (x=0.95) would result in a photodiode of $GaAs_{00.5}N_{0.95}$ and a resulting bandgap energy of approximately 2.3 eV. In yet another example and yet again referring to FIGS. 1 and 2 above, the third photodiode layer 160 built utilizing a $GaAs_{1-x}N_x$ compound semiconductor with a value (x=0.97) would result in a photodiode of $GaAs_{0.03}N_{0.97}$ and a resulting bandgap energy of approximately 2.7 eV.

Exemplary First Buffer Layer

Figure 3A:
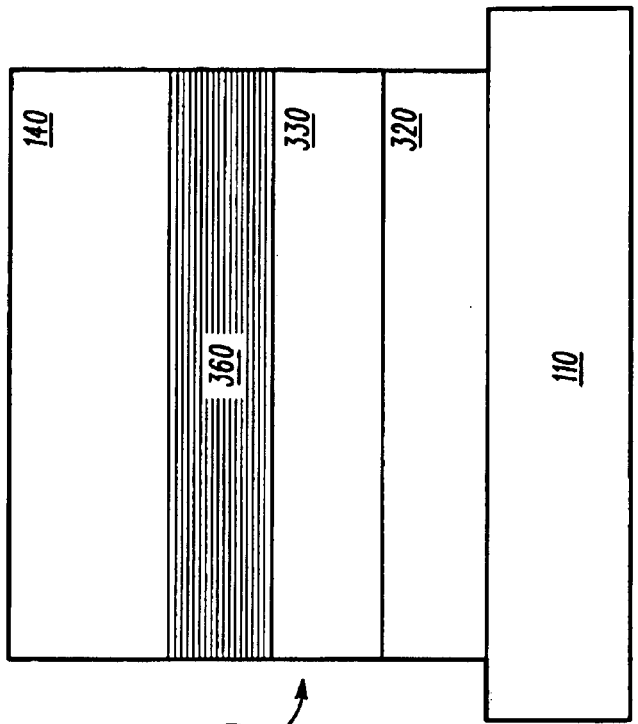
FIG. 3a is a schematic diagram illustrating a portion of a device structure according to an embodiment of the present invention.
Figure 3B:
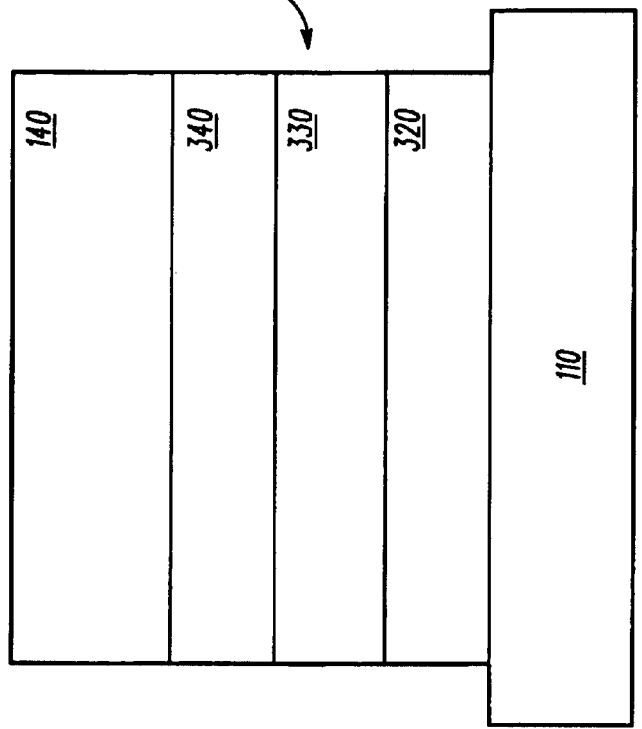
FIG. 3b is a schematic diagram illustrating a portion of a device structure according to another embodiment of the present invention.

FIGS. 3a and 3b are schematic diagrams illustrating a portion of device structure 100, of FIG. 1 above, according to embodiments of the present invention. FIG. 3a includes a monocrystalline substrate 110, a first photodiode layer 140, a first monocrystalline oxide layer 320, a monocrystalline compound semiconductor material 330, and a second monocrystalline oxide layer 340. Like components from FIGS. 1 and 3a are labeled and function identically. In one embodiment, first monocrystalline oxide layer 320, monocrystalline compound semiconductor material 330, and second monocrystalline oxide layer 340 perform the function of first buffer layer 120 of FIG. 1 above.

First monocrystalline oxide layer 320 is formed overlying monocrystalline substrate 110 by a process of molecular beam epitaxy and provides acceptable lattice structural matching and stress release. In one embodiment, first monocrystalline oxide layer 320 is formed from reactants including strontium, titanium, and oxygen (SrTiO), also referred to as STO. In another embodiment, first monocrystalline oxide layer 320 is formed from reactants including barium, titanium and oxygen. In yet another embodiment, first monocrystalline oxide layer 320 is formed from other reactants associated with molecular beam epitaxy, as is known in the art. In one example, 10 nm of STO is deposited on a silicon (Si) wafer.

Monocrystalline compound semiconductor material 330 is formed overlying monocrystalline oxide layer 320 by a process of molecular beam epitaxy and provides acceptable lattice structural matching and stress release. In one embodiment, the deposition of monocrystalline compound semiconductor material 330 is initiated by depositing a layer of arsenic onto monocrystalline oxide layer 320. This initial step is followed by depositing gallium and arsenic to form the monocrystalline compound semiconductor material 330 layer, also referred to as a monocrystalline gallium arsenide (GaAs) layer. Alternatively, other monocrystalline compounds from groups II–V may be substituted for GaAs in the above example, such as for example, indium phosphide (InP), aluminum strontium (AlSr), aluminum barium (AlBa), and the like.

Second monocrystalline oxide layer 340 is built overlying monocrystalline compound semiconductor material 330 and forms a compliant buffer layer providing acceptable lattice structural matching and stress release. In one embodiment, second monocrystalline oxide layer 340 is formed overlying monocrystalline compound semiconductor material 330 by a process of molecular beam epitaxy. In another embodiment, second monocrystalline oxide layer 340 is formed overlying monocrystalline compound semiconductor material 330 utilizing other standard industry practices.

In yet another embodiment, second monocrystalline oxide layer 340 is formed from reactants including zinc and oxygen (ZnO). In another embodiment, second monocrystalline oxide layer 340 is formed from reactants including TiO and SrTiO. In still another embodiment, second monocrystalline oxide layer 340 is formed from other reactants associated with molecular beam epitaxy or other standard industry practices, as is known in the art. In one example, second monocrystalline oxide layer 340 includes 0.2–1.5 microns of ZnO is deposited on the monocrystalline compound semiconductor material 330 layer.

In operation, first buffer layer 120 of FIG. 1, as detailed in FIG. 3a by first monocrystalline oxide layer 320, a monocrystalline compound semiconductor material 330, and a second monocrystalline oxide layer 340, provides a stable lattice structure on which a imaging cell device can be built. Additionally, as desirable wavelengths of light have been absorbed prior to light reaching first buffer layer 120, the thickness of first buffer layer 120 can be much greater than second buffer layer 170 and third buffer layer 180. This additional thickness allows for reduction of lattice mismatch between monocrystalline compound semiconductor material 330 layer and the first photodiode layer 140.

FIG. 3b is an alternative embodiment to a portion of device structure 100, of FIG. 1 above. FIG. 3b includes a monocrystalline substrate 110, a first photodiode layer 140, a first monocrystalline oxide layer 320, and a monocrystalline compound semiconductor material 330 and a layered compound semiconductor 360. Like components from FIGS. 1, 3a and 3b are labeled and function identically. In one embodiment, first monocrystalline oxide layer 320, monocrystalline compound semiconductor material 330, and layered compound semiconductor 360 perform the function of first buffer layer 120 of FIG. 1 above.

Layered compound semiconductor 360 is built overlying monocrystalline compound semiconductor material 330 and forms a compliant buffer layer providing acceptable lattice structural matching and stress release. Layered compound semiconductor 360 is formed utilizing a sequential growth process. In one embodiment, a sequential growth of gallium arsenide nitride (GaAsN) is grown on a gallium arsenide/silicon (Ga/Si) substrate directly by gradually increasing the content of nitride from a very low level to a substantial level.

In an example, the compound semiconductor $GaAs_{1-m}N_m$ is utilized with a sequentially ranging value (m=0.1–0.92). In this example, five monolayers of gallium arsenide (GaAs) can be grown for every monolayer of gallium nitride (GaN). The result is an overall group V lattice site with a nitride concentration of approximately 17% and an arsenide concentration of approximately 83%. Again, the thickness of the buffer layer allows for reduction of lattice mismatch between layered compound semiconductor 360 and the first photodiode layer 140.

Alternative Imaging Cell

Figure 4:
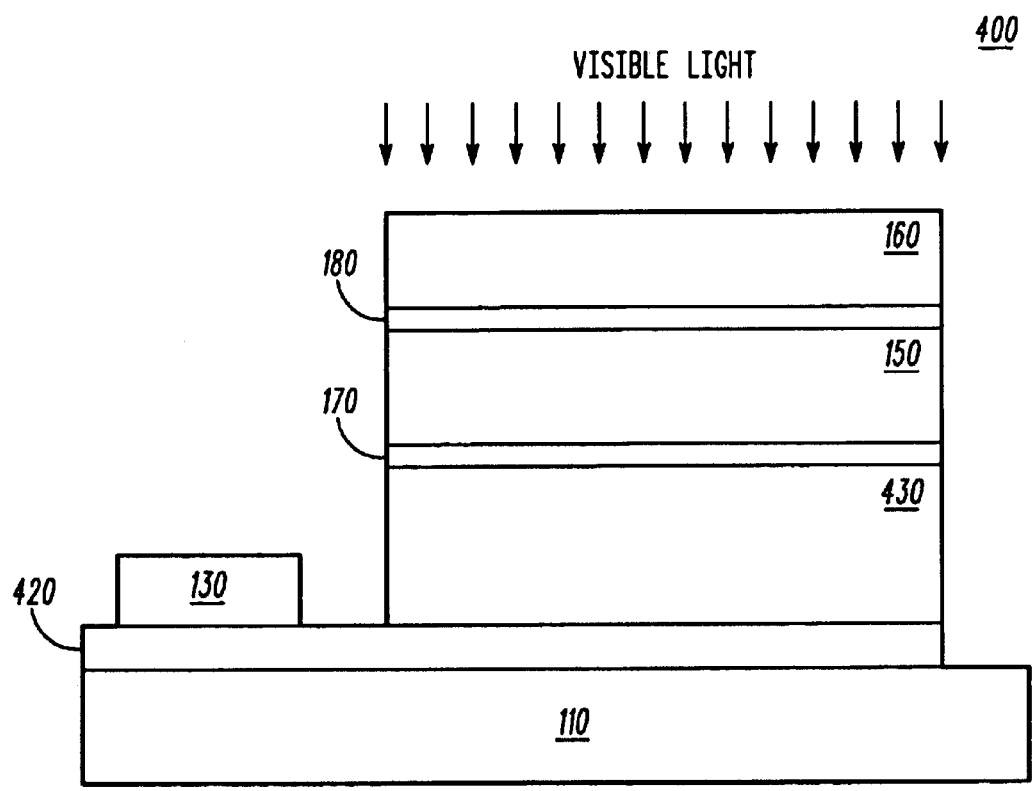
FIG. 4 is a schematic diagram illustrating a device structure according to another embodiment of the present invention.

FIG. 4 is a schematic diagram illustrating a device structure 400, also referred to an imaging cell, according to another embodiment of the present invention. Device structure 400 includes a monocrystalline substrate 110, an exemplary semiconductor device 130, a second photodiode layer 150, a third photodiode layer 160, a second buffer layer 170, a third buffer layer 180, a monocrystalline oxide layer 420, and a monocrystalline compound semiconductor material 430. Like components from FIGS. 1, 3a, 3b, and 4 are labeled and function identically.

Monocrystalline oxide layer 420 is formed overlying monocrystalline substrate 110 by a process of molecular beam epitaxy and provides acceptable lattice structural matching and stress release. In one embodiment, monocrystalline oxide layer 420 is formed from reactants including strontium, titanium, and oxygen (SrTiO), also referred to as STO. In another embodiment, monocrystalline oxide layer 420 is formed from reactants including barium, titanium and oxygen. In yet another embodiment, monocrystalline oxide layer 420 is formed from other reactants associated with molecular beam epitaxy, as is known in the art. In one example, 10 nm of STO is deposited on a silicon (Si) wafer.

Monocrystalline compound semiconductor material 430 is formed overlying monocrystalline oxide layer 420 by a process of molecular beam epitaxy and provides acceptable lattice structural matching and stress release. In one embodiment, the deposition of monocrystalline compound semiconductor material 430 is initiated by depositing a layer of arsenic onto monocrystalline oxide layer 420. This initial step is followed by depositing gallium and arsenic to form the monocrystalline compound semiconductor material 430 layer, also referred to as a monocrystalline gallium arsenide (GaAs) layer. In this embodiment, the gallium arsenide (GaAs) layer on a silicon (Si) wafer allows the use of the GaAs layer as a light detector. In an example, the GaAs layer absorbs light wavelengths at 870 nm and generates an energy bandgap of 1.43 eV allowing for use as a red light detector.

FIG. 4 illustrates a device requiring fewer layers within a production process. By utilizing a monocrystalline compound semiconductor material 430 as a photodiode, the device can be manufactured without the second monocrystalline oxide layer 340 and the first photodiode layer 140 of FIGS. 1 and 3a respectively.

An exemplary operation of the imaging cell 400 will now be described herein. In operation and referring to FIG. 4, visible light, reflecting off of an image, strikes imaging cell 400, the reflected light depicted by vertical arrows. An image contained within the reflected light is converted to a digital image by exemplary semiconductor device 130 based on signals received from one or more photodiode layers as described below.

As the light containing the reflected image passes through the compound semiconductor stack, each of several components within the stack operates upon it. Third photodiode layer 160 absorbs the blue portion of the visible light as it passes through the photodiode. Third buffer layer 180 filters non-absorbed blue spectrum light as the remaining longer portions of light are transmitted through the filter layer. Second photodiode layer 150 absorbs the green portion of the transmitted light as it passes through the photodiode. Second buffer layer 170 filters non-absorbed green spectrum light as the remaining longer portions of light are transmitted through the filter layer. A layer of monocrystalline compound semiconductor material 430 absorbs the red portion of the transmitted light as it passes through the semiconductor material. Each photodiode or layer of semiconductor material produces an associated band gap voltage (eV), described in FIGS. 2 and 4 above, based on the intensity of light absorbed.

The above-described apparatus and processes for increasing the resolution of digital color imaging are example methods and implementations. These methods and implementations illustrate one possible approach for increasing the resolution of digital color imaging. The actual implementation may vary from the method discussed. Moreover, various other improvements and modifications to this invention may occur to those skilled in the art, and those improvements and modifications will fall within the scope of this invention as set forth in the claims below.

The present invention may be embodied in other specific forms without departing from its spirit or essential characteristics. The described embodiments are to be considered in all respects only as illustrative and not restrictive.

We claim:

1. A process for fabricating a tandem color photosensing semiconductor structure comprising:

providing a monocrystalline silicon substrate;

depositing a first buffer layer overlaying the monocrystalline silicon substrate, the first buffer layer epitaxially forming a monocrystalline oxide layer overlying the monocrystalline silicone substrate;

forming a first photodiode layer overlying the first buffer layer, the first photodiode layer operable to provide a first signal indicative of a color associated with the first wavelength of light forming a second buffer layer overlying the first photodiode layer; and forming a second photodiode layer, the second photodiode layer operable to provide a second signal indicative of a color associated with the second wavelength of light, wherein forming the first buffer layer further comprises forming a first monocrystalline oxide film overlying the monocrystalline silicon substrate, forming a monocrystalline compound semiconductor material on the first monocrystalline oxide film, forming a second monocrystalline oxide layer or layered compound semiconductor overlying the monocrystalline compound semiconductor material.

2. The process of claim 1, further comprising:

forming a third buffer layer overlying the second photodiode layer; and forming a third photodiode layer overlying the third buffer layer, the third photodiode layer operable to provide a third signal indicative of a color associated with the third wavelength of light.

3. The process of claim 1 further comprising:

forming a processor, the processor operable to store and process data corresponding to the signals from the first photodiode layer.

4. The process of claim 1 wherein the first photodiode layer includes:

a monocrystalline compound semiconductor material having a thickness of the absorption length of a red portion of visible light.

5. The process of claim 1 wherein the second buffer layer includes:

a monocrystalline compound semiconductor material.

6. The process of claim 1 wherein the second photodiode layer includes:

a monocrystalline compound semiconductor material having a thickness of the absorption length of a green portion of visible light.

7. The process of claim 2 wherein the third buffer layer includes:

a monocrystalline compound semiconductor material.

8. The process of claim 2 wherein the third photodiode layer includes:

a monocrystalline compound semiconductor material having a thickness of the absorption length of a blue portion of visible light.

* * * * *